(12) United States Patent
Moon et al.

(10) Patent No.: US 8,284,959 B2
(45) Date of Patent: Oct. 9, 2012

(54) METHOD AND AN APPARATUS FOR PROCESSING AN AUDIO SIGNAL

(75) Inventors: Jong Ha Moon, Seoul (KR); Hyen O Oh, Seoul (KR); Joon Il Lee, Seoul (KR); Myung Hoon Lee, Seoul (KR); Yang Won Jung, Seoul (KR)

(73) Assignee: LG Electronics Inc., Seoul (KR)

( * ) Notice: Subject to any disclaimer, the term of this patent is extended or adjusted under 35 U.S.C. 154(b) by 495 days.

(21) Appl. No.: 12/511,581

(22) Filed: Jul. 29, 2009

(65) Prior Publication Data

US 2010/0027812 A1     Feb. 4, 2010

Related U.S. Application Data

(60) Provisional application No. 61/084,265, filed on Jul. 29, 2008, provisional application No. 61/118,415, filed on Nov. 26, 2008.

(51) Int. Cl.
*H03G 7/00* (2006.01)
(52) U.S. Cl. .............. 381/106; 381/56; 381/107
(58) Field of Classification Search .......... 381/104–109, 381/61, 56
See application file for complete search history.

(56) References Cited

U.S. PATENT DOCUMENTS

| | | | |
|---|---|---|---|
| 5,907,622 A | 5/1999 | Dougherty | |
| 7,907,739 B2 | 3/2011 | Chuo et al. | |
| 2005/0175194 A1* | 8/2005 | Anderson | ............... 381/106 |
| 2006/0002572 A1 | 1/2006 | Smithers et al. | |
| 2007/0121965 A1 | 5/2007 | Joseph et al. | |
| 2007/0291959 A1* | 12/2007 | Seefeldt | ............... 381/104 |
| 2009/0003620 A1 | 1/2009 | McKillop et al. | |
| 2009/0110373 A1 | 4/2009 | Aoyagi et al. | |

(Continued)

FOREIGN PATENT DOCUMENTS

EP   1172991 A1   1/2002

(Continued)

OTHER PUBLICATIONS

Unknown: "Dynamik-Effekte Kopressor-Limiter-Enhancer-Expander-Noise Gate," XP55014523, URL:HTTP://WWW.MUSIKER-BOARD.DE/FAQ-WORKSHOP-BASS/57752-EFFEKTEKOMPRESSOR-LIMITER-NOISE-GATE-ENHANCER-EXPANDER.HTML, Mar. 31, 2005, 7 pages.

*Primary Examiner* — Disler Paul
(74) *Attorney, Agent, or Firm* — Birch, Stewart, Kolasch & Birch, LLP

(57) ABSTRACT

An apparatus for controlling a volume of an audio signal and method thereof are disclosed, by which a volume of an input signal can be controlled by using a non-linear gain curve and a target volume of the input signal. The present invention includes storing a non-linear gain curve indicating relations between volumes of an input signal and an output signal; receiving an input signal and target volume information; determining a first gain by using the volume of the input signal and the target volume information; determining a second gain from one of a) the volume of the input signal and the target volume information or b) the first gain, by using the non-linear gain curve; and adjusting the volume of the input signal by applying the second gain to the input signal, wherein the non-linear gain curve is generated by using non-linearity information.

A volume of an input signal of this invention is controlled using a non-linear gain curve indicating a relation between a volume of an input signal and a volume of an output signal. Therefore, the present invention is able to reduce or expand a dynamic range of an output volume.

13 Claims, 15 Drawing Sheets

U.S. PATENT DOCUMENTS

| | | |
|---|---|---|
| 2009/0116664 A1* | 5/2009 | Smirnov et al. ............... 381/106 |
| 2010/0027812 A1 | 2/2010 | Moon et al. |
| 2010/0046765 A1 | 2/2010 | De Bruijn et al. |

FOREIGN PATENT DOCUMENTS

| | | |
|---|---|---|
| KR | 10-2000-0001605 U | 1/2000 |
| KR | 10-2000-0033293 A | 6/2000 |
| KR | 10-2003-0054112 A | 7/2003 |
| KR | 10-2005-0011232 A | 1/2005 |
| KR | 10-2006-0008785 A | 1/2006 |
| KR | 10-2007-0113891 A | 11/2007 |
| WO | WO 93/19525 A1 | 9/1993 |
| WO | WO-2008/021110 A2 | 2/2008 |
| WO | WO 2008/054069 A1 | 5/2008 |

* cited by examiner

<Static Characteristic for non-linear adjustment>

<Static Characteristic for non-linear adjustment>

US 8,284,959 B2

METHOD AND AN APPARATUS FOR PROCESSING AN AUDIO SIGNAL

CROSS-REFERENCE TO RELATED APPLICATION

This application claims the benefit of U.S. Provisional Applications No. 61/084,265, filed on Jul. 29, 2008 and No. 61/118,415, filed on Nov. 26, 2008, which are hereby incorporated by references.

BACKGROUND OF THE INVENTION

1. Field of the Invention

The present invention relates to an apparatus for controlling a volume of an audio signal and method thereof. Although the present invention is suitable for a wide scope of applications, it is particularly suitable for automatically controlling a volume of an input signal using reference information or target volume information/non-linear gain curve.

2. Discussion of the Related Art

Recently, electronic device as TV, computers, mobile equipments and the like are widely used for various purposes of business, entertainment and the like. As theses devices are used by a number of users for various purposes, audio signals outputted from the devices occasionally disturb other people.

However, in case that an audio signal received by an electronic device is outputted intact, a volume may be high enough to disturb other people or a user may not be able to listen to a desired audio signal due to a low volume. Moreover, in case that a volume of a received audio signal is controlled on a predetermined condition, characteristics of the audio signal are ignored to lead a user to listen to a distorted audio source.

SUMMARY OF THE INVENTION

Accordingly, the present invention is directed to an apparatus for controlling a volume of an audio signal and method thereof that substantially obviate one or more of the problems due to limitations and disadvantages of the related art.

An object of the present invention is to provide an apparatus for controlling a volume of an audio signal and method thereof, by which a volume of an input signal can be controlled using a non-linear gain curve and a target volume of the input signal.

Another object of the present invention is to provide an apparatus for controlling a volume of an audio signal and method thereof, by which a volume of an input signal is adaptively controlled using reference information.

A further object of the present invention is to provide an apparatus for controlling a volume of an audio signal and method thereof, by which a volume of an audio signal can be controlled using outside environment information obtained from an outside environment adjacent to a decoding apparatus of an audio signal.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings. First of all, terminologies in the present invention can be construed as the following references. And, terminologies not disclosed in this specification can be construed as the following meanings and concepts matching the technical idea of the present invention. Therefore, the configuration implemented in the embodiment and drawings of this disclosure is just one most preferred embodiment of the present invention and fails to represent all technical ideas of the present invention. Thus, it is understood that various modifications/variations and equivalents can exist to replace them at the timing point of filing this application.

In this disclosure, 'information' is the terminology that generally includes values, parameters, coefficients, elements and the like and its meaning can be construed as different occasionally, by which the present invention is non-limited.

Figure 1:
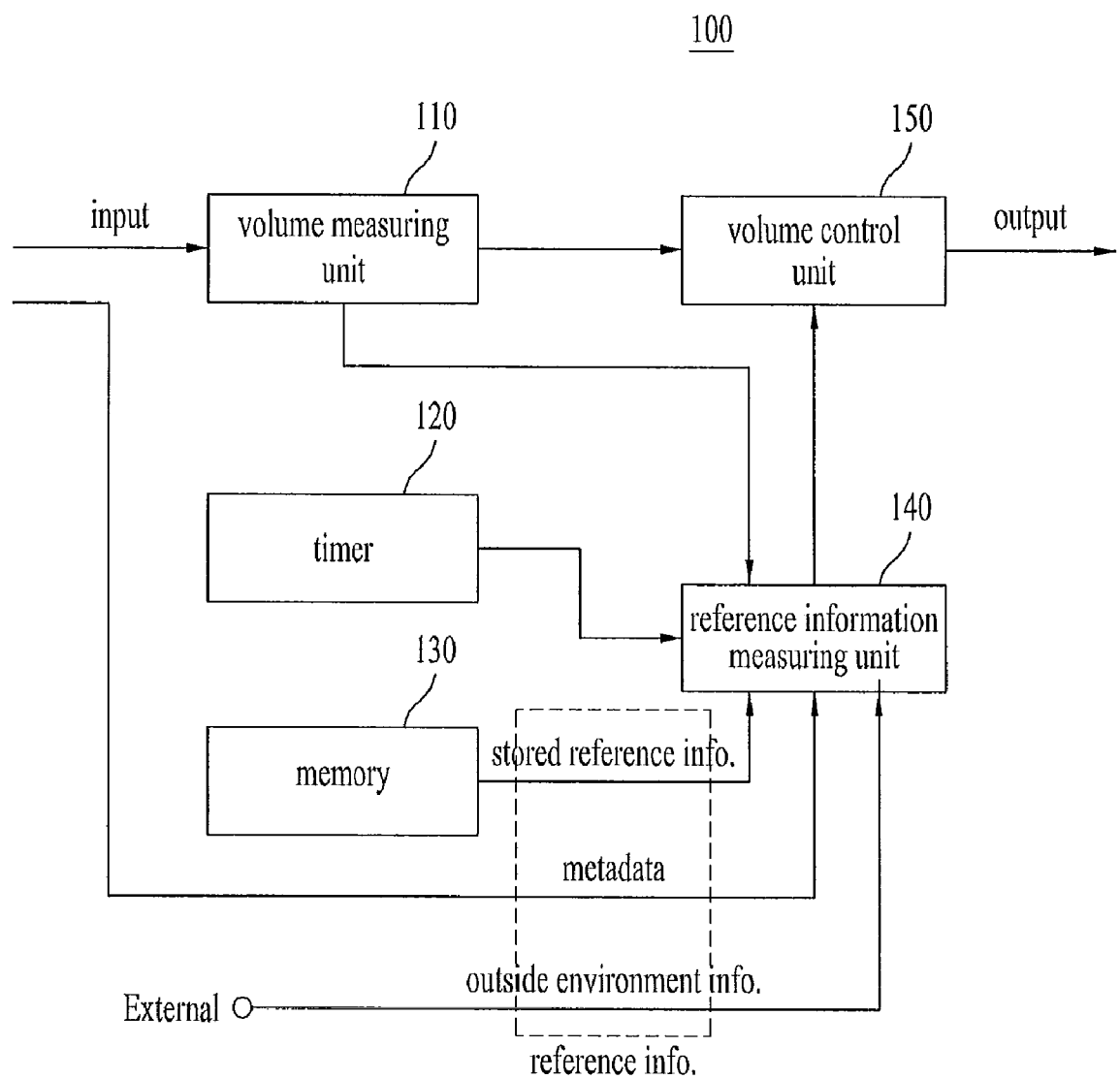
FIG. 1 is a block diagram of an apparatus for controlling a volume of an audio signal according to one embodiment of the present invention.

FIG. 1 is a block diagram of an apparatus 100 for controlling a volume of an audio signal according to one embodiment of the present invention. Referring to FIG. 1, an apparatus 100 for controlling a volume of an audio signal mainly includes a volume measuring unit 110, a timer 120, a memory 130, a reference information measuring unit 140 and a volume control unit 150. First of all, the volume measuring unit 110 receives an input of an input signal, which is an audio signal, and then measures a volume. In this case, the volume can be represented as one of an energy level, power or power approximate value and the like of the input signal, by which the present invention is non-limited. And, the volume is used as a terminology that indicates a volume of signal. Moreover, the volume measuring unit 110 is able to measure a volume of the input signal in a time domain or can measure a volume in a frequency domain. In case of measurement in a frequency domain, an input signal in a time domain can be converted to a signal in a frequency domain. This will be explained in detail with reference to FIG. 2 later.

Meanwhile, the timer 120 is able to measure a replay time of an input signal or can announce a present time separately.

The memory 130 can include a storage medium capable of storing informations for controlling the input signal in advance as well as the input signal. And, the memory 130 can store a final gain generated to control a volume of the input signal or a volume controlled input signal in the future. The information stored in the memory 130 and a method for the information to control the volume of the input signal will be explained in detail with reference to the accompanying drawings including FIG. 7 and the like later.

The reference information measuring unit 140 receives reference information used for controlling a volume of an input signal and is then able to measure a reference volume from the received reference information. In this case, the reference information can include at least one of metadata indicating characteristics of the input signal, outside environment information indicating characteristics of an outside environment and storage reference information received from the memory. The reference information measuring unit 140 generates a specific volume value itself as the reference volume and then outputs the generated specific volume value to the volume control unit 150. Moreover, the reference information measuring unit 140 is able to generate and output a gain value that will be applied to the input signal by the volume control unit 150 to provide a specific volume value. In case that the reference volume is the specific volume value itself, the volume control unit 150 shall further include a gain calculating unit (not shown in the drawing) capable of calculating a gain using the specific volume value and a volume of an input signal.

The volume control unit 150 controls a volume of an input signal using a reference volume outputted from the reference information measuring unit 140. As mentioned in the foregoing description, if the reference volume is the specific volume value itself, the volume control unit 150 includes a gain calculating unit. In case that the reference volume is a gain value, the gain value is applied to an input signal to control a volume thereof. Moreover, in case that the volume measuring unit 110 measures a volume of an input signal in a frequency domain, the volume control unit 150 is also able to control a volume in the frequency domain using the reference information.

Thus, by analyzing sound in a frequency domain, characteristics of the sound directly heard by a listener via ears can be taken into consideration. For example, sound on an audible band is easily perceived, whereas sound belonging to a range outside the audible band is not easily perceived. By taking theses characteristics into consideration, it is able to control an input signal. Therefore, the volume measuring unit 110 and the volume control unit 150 measures and controls a volume in the frequency domain, whereby perceptual coding can be performed.

Figure 2A:
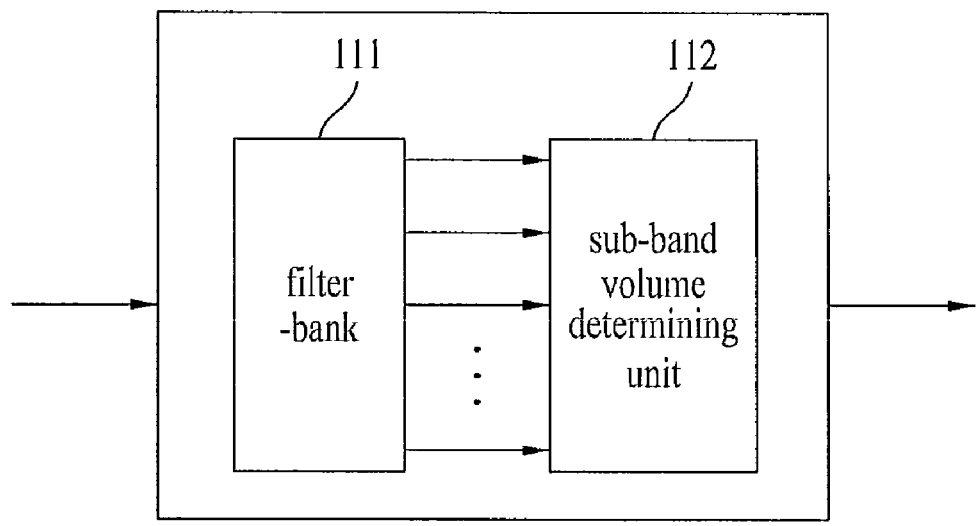
FIG. 2 is a block diagram of a volume measuring unit shown in FIG. 1 according to one embodiment of the present invention.

FIG. 2 is a block diagram of a volume measuring unit shown in FIG. 1 according to one embodiment of the present invention. Referring to FIG. 2, the volume measuring unit 110 can include a filter bank 111 and a sub-band volume determining unit 112. The filter bank 111 converts an input signal into a frequency-domain input signal and classifies it into subbands. The filter bank 111 is able to perform frequency conversion in equivalent rectangular bandwidth frequency scale (ERB frequency scale). In this case, the ERB frequency scale is based on human frequency resolution and enables perceptual coding. And, the sub-band volume measuring unit 112 measures a volume per the sub-band classified by the filter bank 111.

Figure 3:
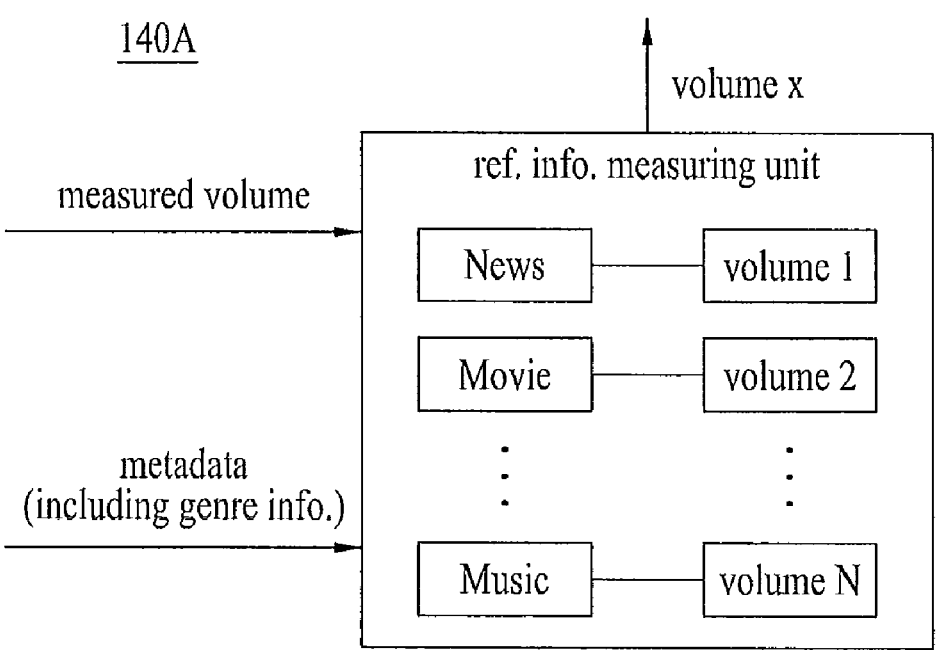
FIGS. 3 to 5 are block diagrams for various embodiments of a reference information measuring unit shown in FIG. 1.
Figure 4:
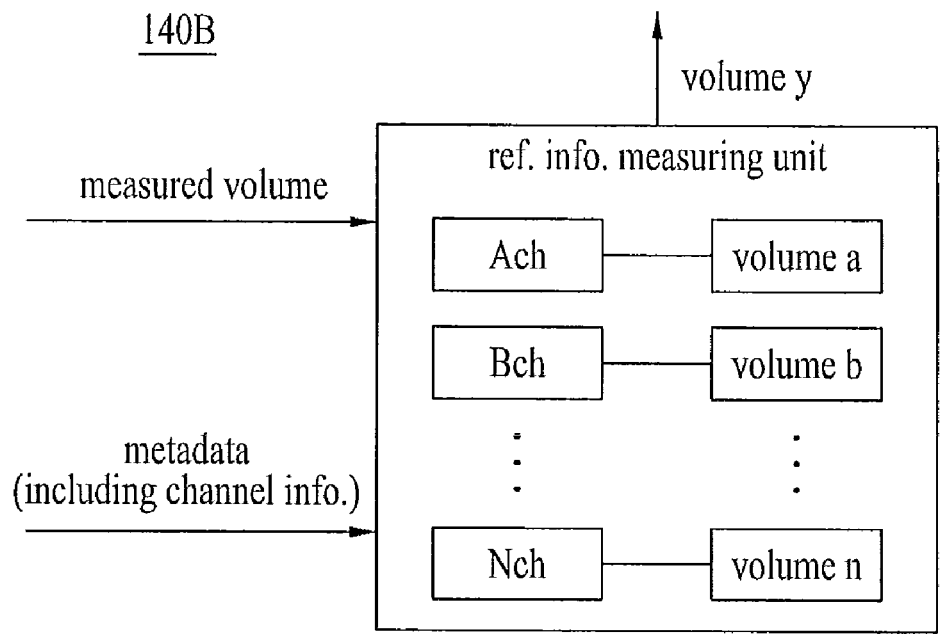
Figure 5:
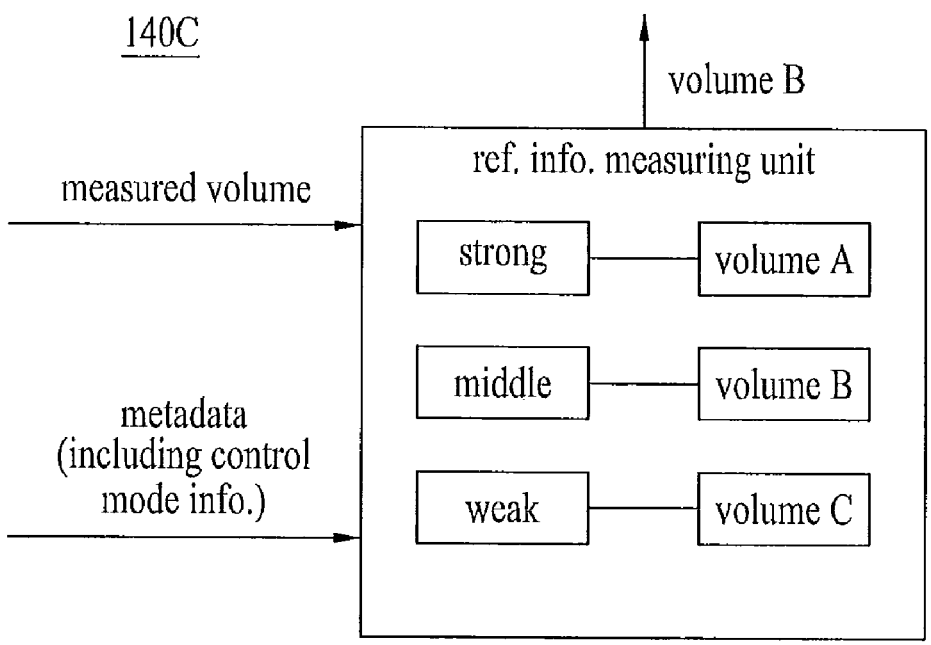

FIGS. 3 to 5 are block diagrams for various embodiments of the reference information measuring unit 140 shown in FIG. 1. FIGS. 3 to 5 show a case that metadata indicating characteristics of an input signal is inputted as reference information.

Referring to FIG. 3, a reference information measuring unit 140A is able to receive an input of metadata including genre information. In this case, the genre information indicates that an input signal belongs to a prescribed one of general classifications such as news, movie, music broadcast, drama and the like. In case that an input signal is news, it is necessary to control sound corresponding to a voice range only. Since a signal corresponding to the rest of the range is highly possible to be a noise, a volume can be almost adjusted to the bottom. Meanwhile, in case that an input signal corresponds to a movie, as the input signal is evenly distributed over all bands, a volume control different from that of the news is required. Therefore, the reference information measuring unit 140A controls a volume of an input signal using a reference volume corresponding to each genre information stored in advance. In this case, the reference volume corresponding to the genre information can be stored as a lookup table or the like.

Meanwhile, if the genre information indicates the music broadcast, a level of an input signal may not be controlled using reference information. In case of the music broadcast, as an input signal is characterized in that a variation of volume of an input signal is considerable as well as the input signal is evenly distributed over whole bands, it may be possible that a sound source is distorted by controlling the volume of the input signal using the reference information. Therefore, in case that metadata inputted as reference information indicates a music broadcast, it is able to output an input signal intact without controlling a volume of the input signal.

Whether the metadata indicates the music broadcast can be determined in various ways. First of all, information indicating the music broadcast can be directly included in the metadata. Secondly, after EPG (electronic program guide) has been examined, if a word of 'music' is included in a program title or content, it can be determined as the music broadcast. Thirdly, if a genre classifier (not shown in the drawing) is included in the reference information measuring unit 140A, it is able to determine whether it is a music broadcast using information except the metadata. Fourthly, after a power value of a specific frequency of an input signal has been analyzed, if a volume fluctuation width of a signal is considerable and the input signal is evenly distributed over the whole band, it can be determined as the music broadcast.

Referring to FIG. 4, reference information can be metadata including channel information. In this case, the channel information may include the information indicating a broadcast channel or information indicating a reference volume corresponding to a broadcast channel. If a channel is switched, the channel information can be inputted to a reference information measuring unit 140B. If the channel switching occurs, a volume corresponding to the switched channel is selected and then outputted as a reference volume.

Meanwhile, although the volume corresponding to the switched channel may have a stationary value, an average volume of each channel is stored to use in order to reduce inter-channel deviation. For instance, if an average volume of a channel A for a week is (ref+A) dB and an average volume of a channel B for a week is (ref−B) dB, it a channel is switched to the channel A, after a volume has been modified by −A dB, it is able to control a volume of an input signal.

Referring to FIG. 5, a reference information measuring unit 140C according to one embodiment of the present invention enables a user to select strength of a volume control.

Since the reference information measuring unit 140C is provided with the setting of a reference volume corresponding to a control mode, if control mode information is included in metadata, it is able to output a corresponding reference volume. The control mode information can be inputted to the reference information measuring unit 140C using a user interface (UI).

Figure 6:
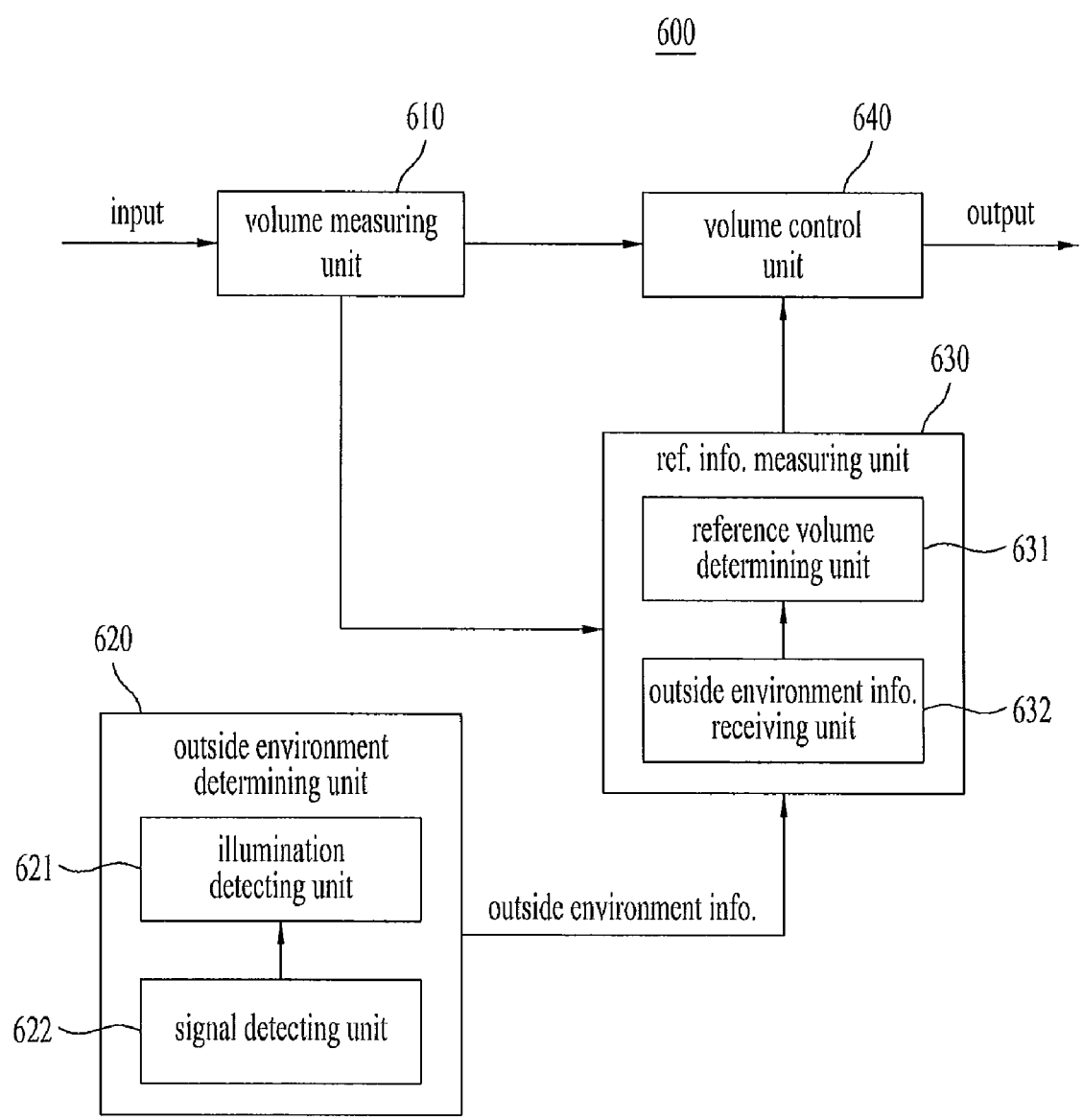
FIG. 6 is a block diagram of an apparatus for controlling a volume of an audio signal according to another embodiment of the present invention.

FIG. 6 is a block diagram of an apparatus 600 for controlling a volume of an audio signal according to another embodiment of the present invention.

Referring to FIG. 6, an apparatus 600 for controlling a volume of an audio signal includes a volume measuring unit 610, an outside environment detecting unit 620, a reference information measuring unit 630 and a volume control unit 640. As the volume measuring and control units 610 and 640 have the same configurations and functions of the former volume measuring and control units 110 and 150 shown in FIG. 1, their details are omitted in the following description.

The outside environment detecting unit 620 measures outside environment in proximity to the audio signal volume controlling apparatus such that generates outside environment information. And, the outside environment detecting unit 620 includes an illumination detecting unit 621 and a signal detecting unit 622. The illumination detecting unit 621 measures intensity of illumination (brightness) for an environment in proximity to the apparatus. In this case, it is able to use an illuminometer. The signal detecting unit 622 receives an ambient sound of the outside environment adjacent to the apparatus via a receiver or the like and then measures a volume of the ambient sound.

Unlike the former reference information measuring unit 140 shown in FIG. 1, the reference information measuring unit 630 includes an outside environment information receiving unit 632 and a reference volume determining unit 631. The outside environment information receiving unit 632 receives an illumination intensity of the outside environment or a volume of the ambient sound from the outside environment detecting unit 620. Meanwhile, the reference volume determining unit 631 is able to output a reference level corresponding to the illumination intensity of the outside environment or the volume of the ambient sound using a lookup table between a preset illumination/volume and a reference volume or the like. In this case, the lookup table is stored in the reference volume determining unit 631 or can be stored in the memory 130 shown in FIG. 1.

In case that an illumination intensity of an outside environment is inputted as outside environment information from the illumination detecting unit 621, if the illumination intensity is high, it is able to output a high reference volume. If the illumination intensity is low, it is able to output a low reference volume. Meanwhile, in case that a volume of an ambient sound is inputted from the signal detecting unit 622, a higher reference volume is outputted in proportion to a volume of the ambient sound. Therefore, it is able to adaptively control a volume of an input signal.

Moreover, in case that the input signal is a video signal, it is able to control brightness of a video signal using illumination intensity of an outside environment measured by the illumination detecting unit 621 [not shown in the drawing]. If the illumination intensity of the outside environment is low, a user is able to feel the brightness of the video signal as relatively high. If the illumination intensity of the outside environment is high, a user is able to feel the brightness of the video signal as relatively low. Therefore, if the illumination intensity of the outside environment measured by the illumination detecting unit 621 is low, the brightness of the inputted video signal is controlled low. If the illumination intensity of the outside environment measured by the illumination detecting unit 621 is high, the brightness of the inputted video signal is controlled high. Thus, it is able to enhance sensitivity.

Moreover, in case that a specific signal is inputted to a memory (not shown in the drawing), it is able to store storage reference information to output a corresponding volume or gain value. Thus, if a stored specific signal is inputted to the signal detecting unit 622 from the outside environment, the reference information measuring unit 630 receives an input of the storage reference information from the memory and is then able to output a reference volume or a gain value. For instance, if there is an phone ring or a bell sounds, a listener mostly controls a volume of an audio signal to be lowered.

Therefore, after the phone ring sound, the bell sound or the like has been stored as storage reference information in the memory together with a corresponding volume or gain value, it is able to provide a listener with convenience by controlling a volume of an input signal using the stored information as reference information.

Figure 7:
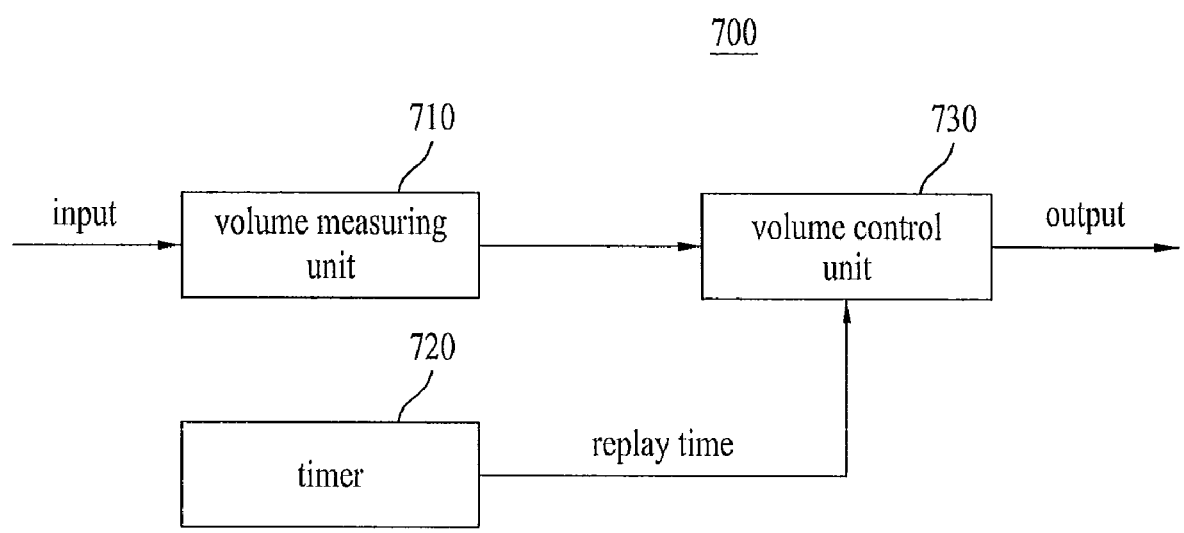
FIG. 7 is a block diagram of an apparatus for controlling a volume of an audio signal according to a further embodiment of the present invention.

FIG. 7 is a block diagram of an apparatus 700 for controlling a volume of an audio signal according to a further embodiment of the present invention.

Referring to FIG. 7, an apparatus 700 for controlling a volume of an audio signal includes a volume measuring unit 710, a timer 720 and a volume control unit 730. The volume measuring unit 710 measures a replay volume v of an input signal in a frequency domain. The timer 720 is able to measure a replay time t of the input signal. Meanwhile, the volume control unit 730 is able to control a volume of an input signal with reference to a replay volume and replay time of the input signal.

Figure 8:
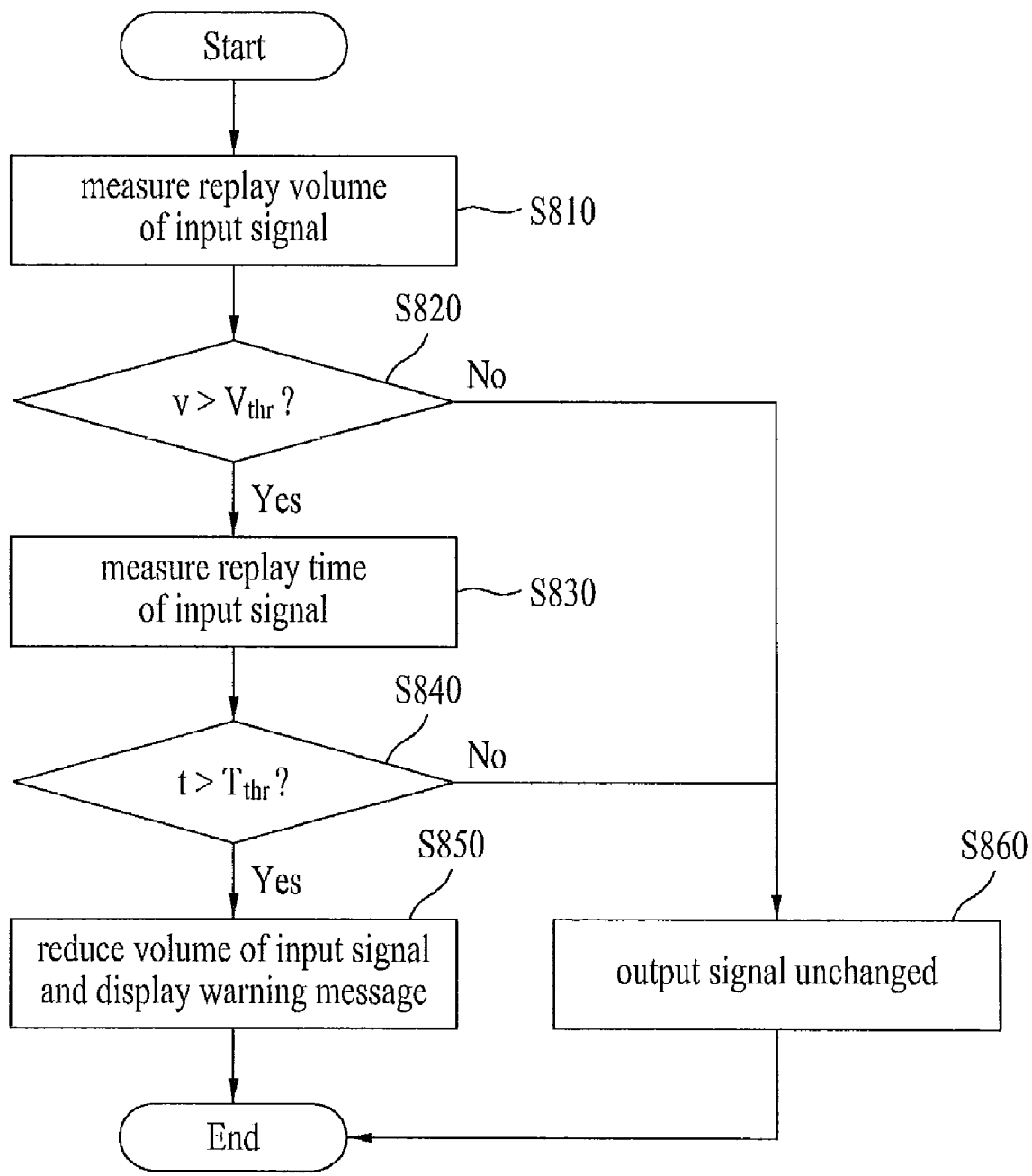
FIG. 8 is a flowchart for a method of controlling a volume of an input signal in the audio signal volume controlling apparatus shown in FIG. 7.

FIG. 8 is a flowchart for a method of controlling a volume of an input signal in the audio signal volume controlling apparatus shown in FIG. 7.

Referring to FIG. 8, a replay volume of an input signal is measured [S810]. In this case, it is determined whether the replay volume v exceeds a specific value ($V_{thr}$, volume threshold) [S820]. If the replay volume v is equal to or smaller than the specific value, the input signal is outputted intact without controlling a volume of the input signal [S860].

On the contrary, if the replay volume v exceeds the specific value, a replay time t of the input signal is measured [S830]. It is then determined whether the replay time t exceeds a specific value ($T_{thr}$: time threshold) [S840]. If the replay time t is equal to or smaller than the specific value, the input signal is outputted intact without controlling the volume of the input signal as well [S860]. Yet, if the replay time t is greater than the specific value $T_{thr}$, the volume of the input signal is lowered to prevent audibility damage and a warning message (e.g., a text announcing 'audibility damage may be caused due to long-time listening', etc.) is simultaneously displayed [S850].

Listening to a loud signal for a long time may cause audibility damage. In case that a loud sound is listened to using a mobile device such as a mobile phone, an MP3, a Bluetooth earphone and the like, an accident may take place due to the difficulty in hearing an ambient sound. Therefore, it is able to prevent theses problems by controlling a volume of an input signal using a replay time and a replay volume.

Figure 9:
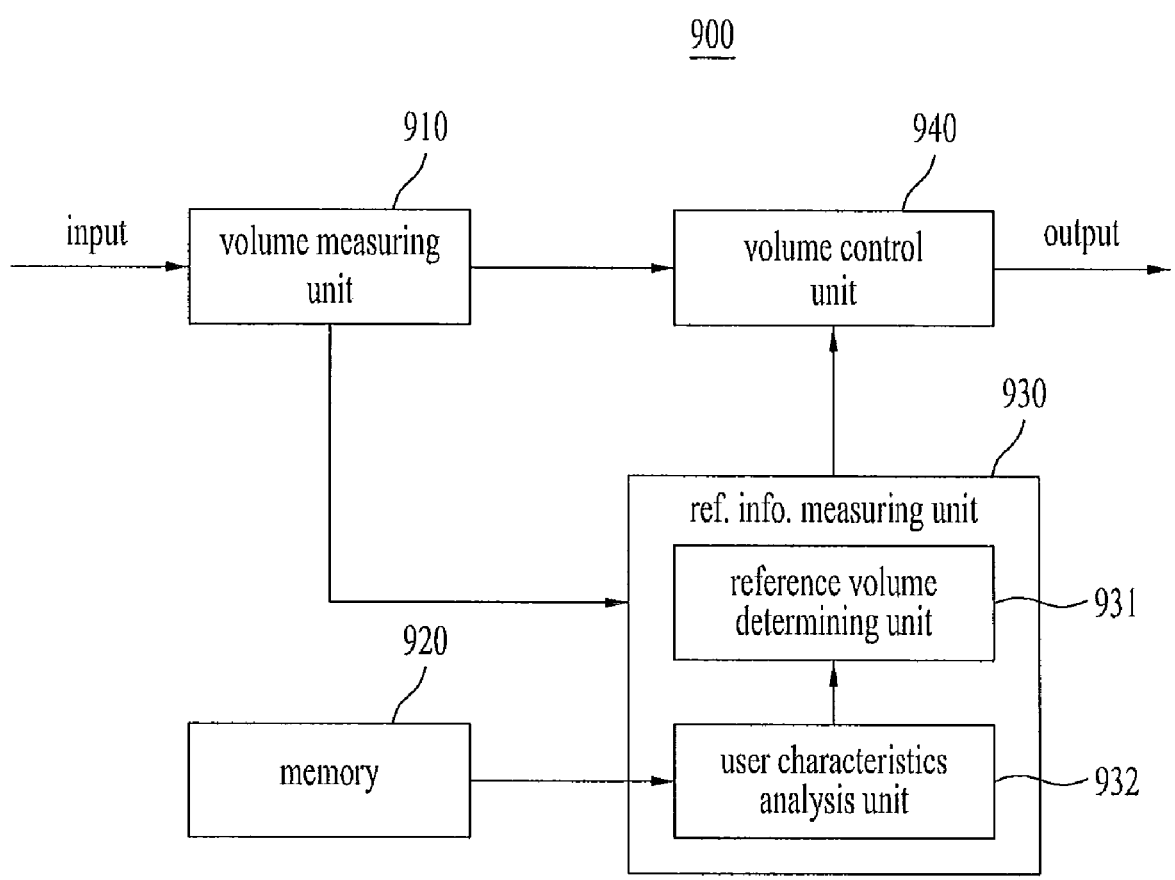
FIG. 9 and FIG. 10 are block diagrams for various embodiments of an apparatus for controlling a volume of an audio signal.
Figure 10:
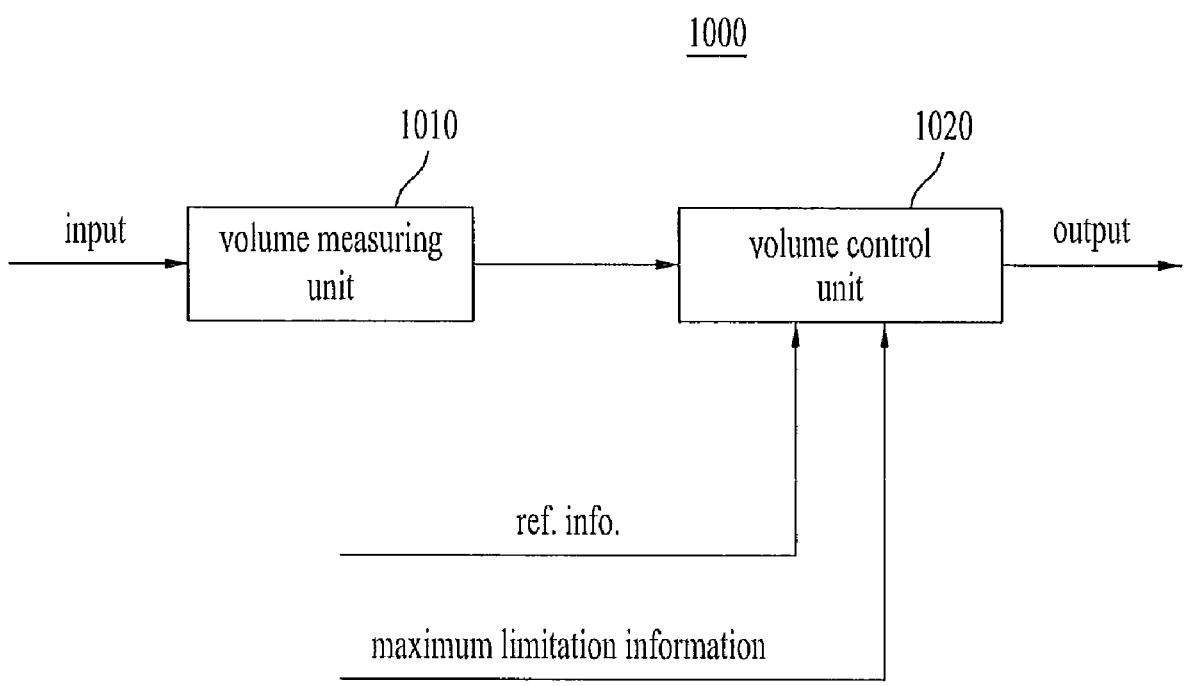

FIG. 9 and FIG. 10 are block diagrams for various embodiments of an apparatus for controlling a volume of an audio signal.

Referring to FIG. 9, an apparatus 900 for controlling a volume of an audio signal includes a volume measuring unit 910, a memory 920, a reference information measuring unit 930 and a volume control unit 940. As the volume measuring and control units 910 and 940 have the same configurations and functions of the former volume measuring and control units 110 and 150 shown in FIG. 1, their details are omitted in the following description.

The memory 920 can store a user input and a listening history therein. For instance, information indicating an average value of a volume inputted by a user on a specific channel, information indicating an average value of a volume inputted by a user in a specific genre, and the like can be stored as storage reference information.

The reference information measuring unit 931 includes a user characteristic analysis unit 931 and a reference volume determining unit 932. The user characteristic analysis unit 931 receives an input of the storage reference information from the memory 920 and then analyzes the received storage reference information. For instance, the reference information inputted from the memory 920 can indicate that a user frequently controls an output volume into 32 dB during 20:00~23:00 and that the user frequently controls the output volume into 45 dB during 10:00~15:00. In this case, the user characteristic analysis unit 931 analyzes the inputted information and measures a present time. If the measured present time corresponds to 20:00~23:00, the user characteristic analysis unit 931 outputs information indicating to preferentially control an output volume into 32 dB.

The reference volume determining unit 932 determines a reference volume for controlling the input signal using the input signal volume inputted from the volume measuring unit 910 and the information inputted from the user characteristic analysis unit 931.

By controlling the volume of the input signal using the reference volume, the volume control unit 940 is able to output a signal having the user's listening history thereon.

Referring to FIG. 10, a volume measuring unit 1020 can receive an input of a maximum volume limitation value together with the above described reference information. This can be inputted as the storage reference information from the memory or can be inputted by a user. If the maximum volume limitation value is inputted as well as the reference information, a volume control unit 1020 is able to control a volume by applying the maximum volume limit value to the input signal most preferentially.

Thus, if the maximum volume limitation value is used, when a device for outputting an audio signal is turned on in the late time at light, it is able to prevent an input signal from being outputted loudly. Therefore, it is able to avoid inconvenience caused by the loud sound.

FIGS. 11A to 11E are diagrams for an audio signal decoding apparatus according to another embodiment of the present invention, in which other algorithms are used together with the above mentioned audio signal volume controlling apparatus.

Figure 11A:
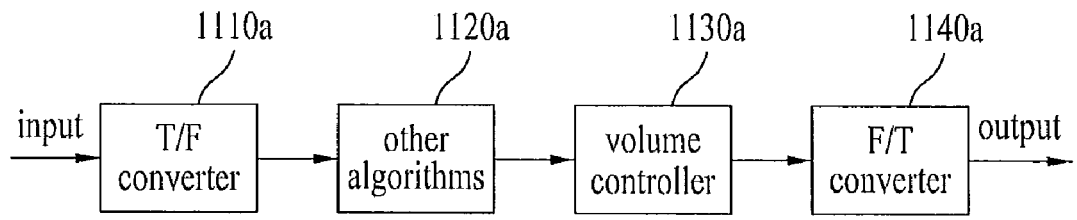
FIGS. 11A to 11E are diagrams for an audio signal decoding apparatus according to another embodiment of the present invention.
Figure 11B:
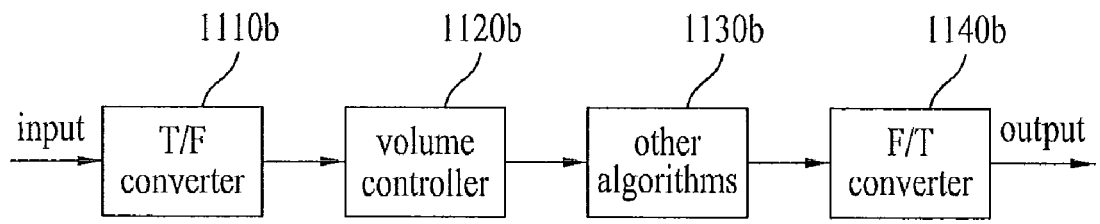

Referring to FIG. 11A and FIG. 11B, other algorithms and an audio signal volume controlling apparatus (hereinafter named a volume controller) according to one embodiment of the present invention are implemented in a frequency domain. In case that the same frequency resolution and time unit are provided, other algorithm 1120a/1130b and the volume controller 1130a/1120b are connected to each other in a frequency domain and FFT and IFFT operations can be performed once only. Moreover, since some parameters are available for both of the other algorithm and the volume controller, it is able to enhance a quantity of operation. Referring to FIG. 11A, the other algorithm 1120a is applied to an input signal ahead of the volume controller 1130a. Referring to FIG. 11B, the other algorithm and the volume controller 1130a are applied to the input signal in reverse order, which can be modified if necessary.

Figure 11C:
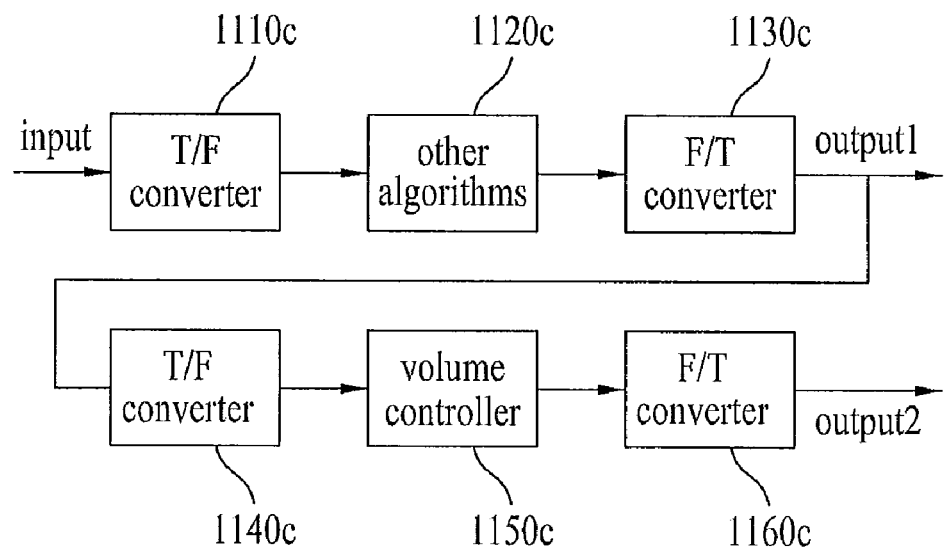
Figure 11D:
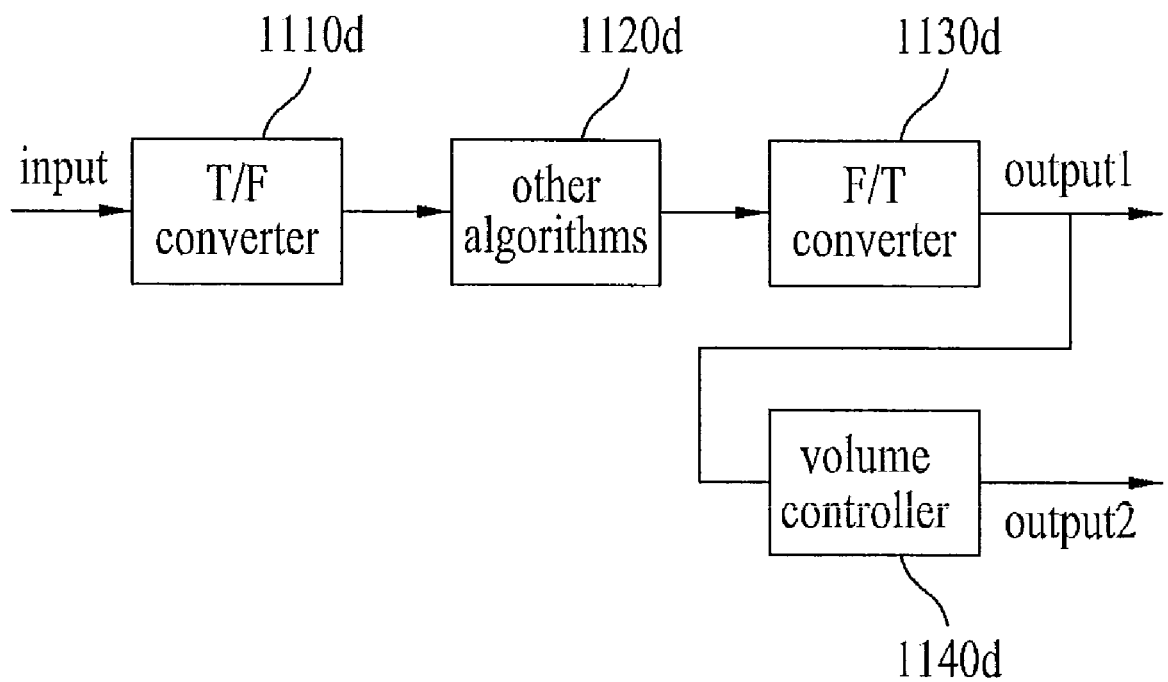

FIG. 11C and FIG. 11D show another embodiment indicating that other algorithms 1120c/1120d and a volume controller 1150c/1140d are connected to each other in a time domain despite supporting operation in a frequency domain. In this case, it is able to directly output an input signal having other algorithms 1120c/120d applied thereto only [Output 1]. Alternatively, it is able to output an input signal of which volume is controlled by having the volume controller 1150c/1140d applied thereto [output 2].

Figure 11E:
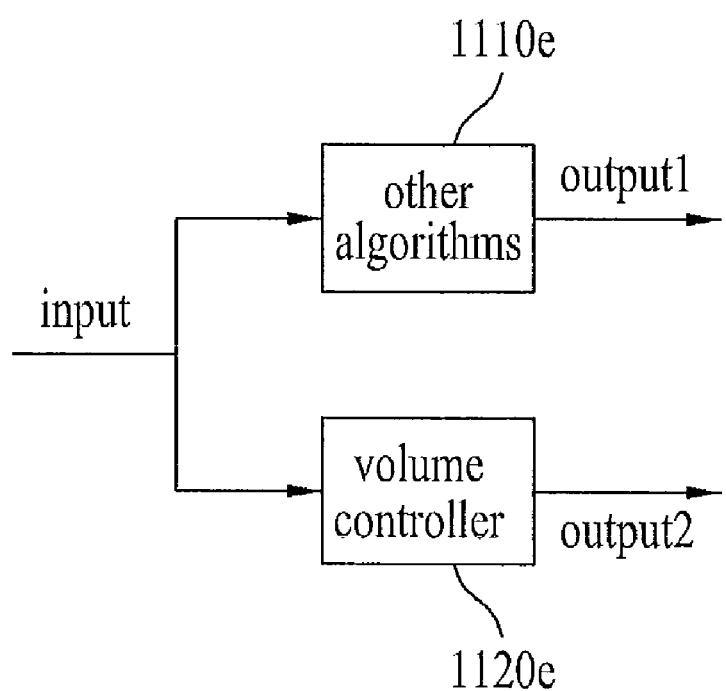

Moreover, FIG. 11E shows another embodiment indicating a case that other algorithms 110e and a volume controller 1120e are independently applied.

Figure 12:
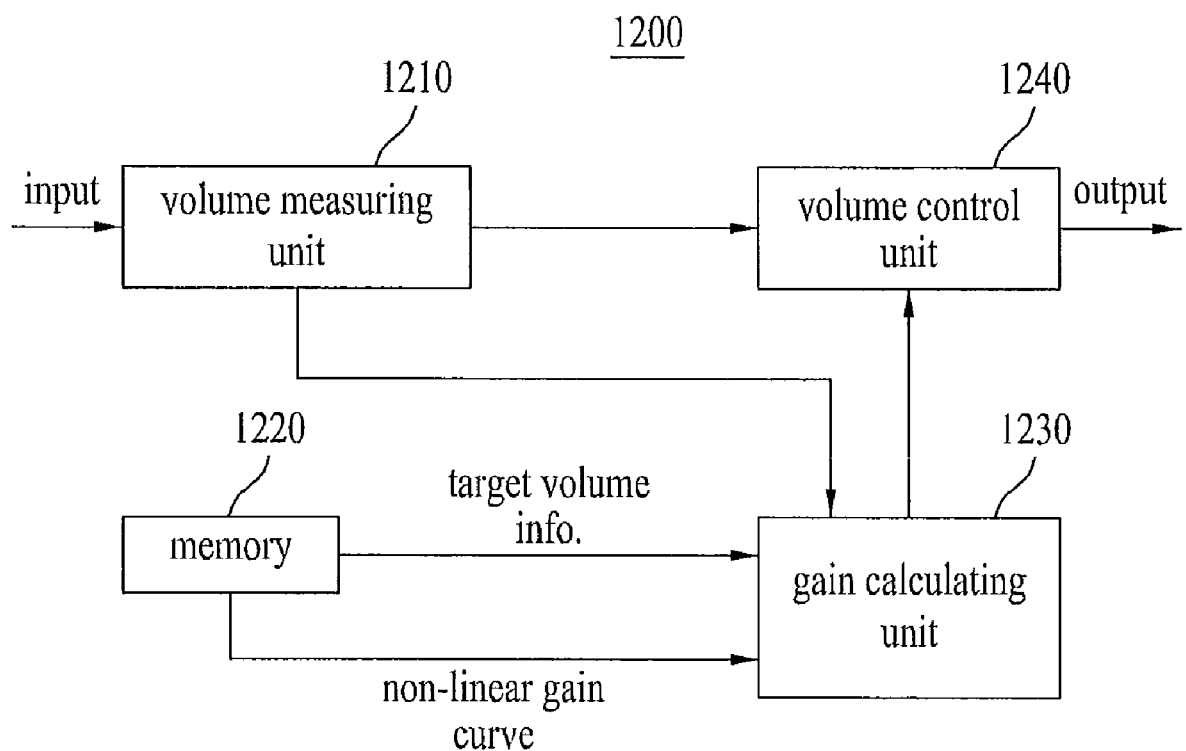
FIG. 12 is a block diagram of an audio signal volume controlling apparatus for controlling a volume of an input signal by calculating a gain using a non-linear gain curve according to another embodiment of the present invention.

FIG. 12 is a block diagram of an audio signal volume controlling apparatus for controlling a volume of an input signal by calculating a gain using a non-linear gain curve according to another embodiment of the present invention.

Referring to FIG. 12, an audio signal volume controlling apparatus 120 includes a volume measuring unit 1210, a memory 1220, a $1^{st}$ gain calculating unit 1230, a $1^{st}$ gain modifying unit 1240, a $2^{nd}$ gain calculating unit and a volume control unit. The volume measuring unit 1210 is able to measure a volume of an input signal. A method of measuring a volume is equal to that of the former volume measuring unit 110 shown in FIG. 1 and its details will be omitted.

The memory 1220 can store target volume information indicating a target volume of the input signal and a non-linear gain curve indicating relation between volumes of an input signal and an output signal.

The gain calculating unit 1230 receives an input of the target volume information and a non-linear gain curve from the memory 1220 and an input of the measured volume from the volume measuring unit 1210, it then able to determine a gain for adjusting a volume of the input signal.

In this case, the available non-linear gain curve can be generated by using non-linearity information. The non-linearity information indicates to have characteristics of non-linearity and includes at least one of volume compressor strength information indicating an extent of compression in compressing a volume of an input signal, volume expander strength information indicating an extent of expansion in expanding a volume of an input signal, a target volume indicating a volume bypassed instead of controlling a volume of an input signal, a maximum compression volume indicating a reference volume corresponding to an input signal necessary to be compressed most, and a minimum compression volume indicating a reference volume corresponding to an input signal necessary to be compressed least.

Meanwhile, according to one embodiment of the present invention, the non-linear gain curve can be generated by modifying a linear gain curve, which is generated using the volume compressor strength information, the volume expander strength information and the target volume, using the maximum compression volume and the minimum compression volume. Relevant parameters will be explained in detail with reference to FIG. 15 and FIG. 16 later.

Thus, if the non-linear gain curve is used to adjust a volume of the input signal, an output volume of dynamic range is reduced or expanded according to a characteristic of the input signal.

Figure 13A:
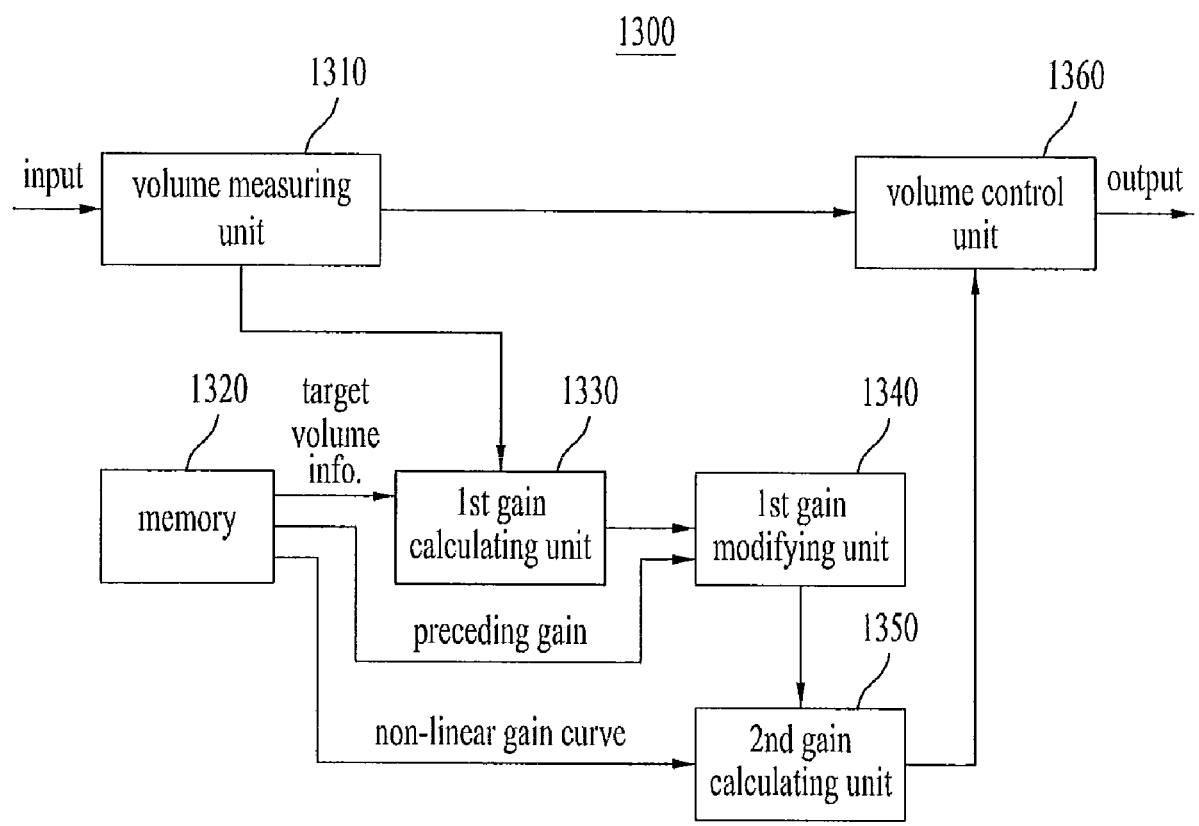
FIG. 13 is a block diagram of an audio signal volume controlling apparatus for controlling a volume of an input signal by calculating a first gain and a second gain using a preceding gain and a non-linear gain curve according to another embodiment of the preset invention.

FIG. 13 is a block diagram of an audio signal volume controlling apparatus for controlling a volume of an input signal by calculating a second gain using a non-linear gain curve according to another embodiment of the present invention.

Referring to FIG. 13, an audio signal volume controlling apparatus 1300 includes a volume measuring unit 1310, a memory 1320, a first gain calculating unit 1330, a first gain modifying unit 1340, a second gain calculating unit 1350 and a volume control unit 1360. The volume measuring unit 1310 is able to measure a volume of an input signal in a current frame. A method of measuring a volume is equal to that of the former volume measuring unit 110 shown in FIG. 1 and its details will be omitted.

The memory 1320 can store target volume information indicating target volume information indicating a target volume of the input signal in the current frame, a preceding gain of input signal in a preceding frame and a non-linear gain curve indicating relation between volumes of an input signal and an output signal.

The first gain determining unit 1330 receives an input of the target output information from the memory 1320, receives an input of the measured volume from the volume measuring unit 1310, and it then able to determine a first gain for the input signal in the current frame using the inputs. Preferably, a target volume in a current frame is obtained from target output information, a difference value between a measured volume of the input signal and a target volume is calculated, and compensation is then performed by applying the difference value to the input signal. Hence, it will be able to determine the first gain using the compensated input signal and the initially inputted signal. In this case, the gain is a gain value and indicates a value applied to an input signal to generate a volume of a final output signal.

Yet, in case that a volume of an input signal is controlled using a first gain determined by the above method, fluctuation of the controller volume may be considerable. Hence, howling may take place.

Therefore, it is necessary to reflect a gain for an input signal in a preceding frame (preceding gain) on the first gain. According to one embodiment of the present invention, as mentioned in the foregoing description, the first gain modifying unit 1340 generates a modified first gain modified by applying a preceding gain for an input signal in a preceding frame inputted from the memory 1320 to the first gain, in order to prevent the howling phenomenon. Preferably, it is able to generate a modified first gain by applying a difference value between the first gain and the preceding gain to the first gain.

The second gain determining unit 1350 determines a second gain from the modified first gain using the non-linear gain curve inputted from the memory 1320. In this case, the available non-linear gain curve can be generated using at least one of volume compressor strength information indicating an extent of compression in compressing a volume of an input signal, volume expander strength information indicating an extent of expansion in expanding a volume of an input signal, a target volume indicating a volume bypassed instead of controlling a volume of an input signal, a maximum compression volume indicating a reference volume corresponding to an input signal necessary to be compressed most, and a minimum compression volume indicating a reference volume corresponding to an input signal necessary to be compressed least.

Preferably, in the present invention, volume compression strength information $\beta_C$ is the information for controlling a dynamic range of a whole volume to decrease in a manner of controlling a volume to decrease if a volume of an input signal used as information by a compressor is large or controlling a volume to increase if the volume of the input signal is small. On the contrary, volume expander strength information $\beta_E$ is the information for controlling a dynamic range of a whole volume to increase in a manner of controlling a volume to further increase if a volume of an input signal used as information by an expander is large or controlling a volume to further decrease if the volume of the input signal is small. Moreover, a maximum compression volume $C_{Tm}$ indicates a maximum limit value for decreasing a volume of an input signal and a minimum compression volume $E_{Tm}$ indicates a minimum limit value for decreasing a volume of an input signal.

Meanwhile, according to one embodiment of the present invention, the non-linear gain curve can be generated by modifying a linear gain curve, which is generated using the volume compressor strength information, the volume expander strength information and the target volume, using the maximum compression volume and the minimum compression volume. Relevant parameters will be explained in detail with reference to FIG. 15 and FIG. 16 later.

Figure 14A:
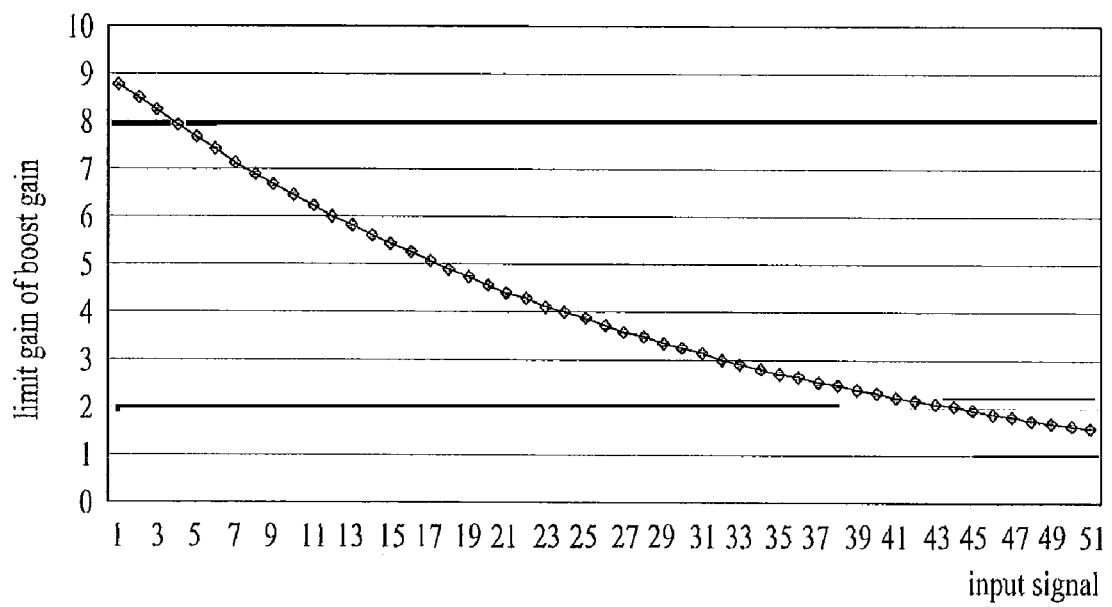
FIG. 14A and FIG. 14B are graphs for examples of a non-linear gain curve used for another embodiment of the present invention.
Figure 14B:
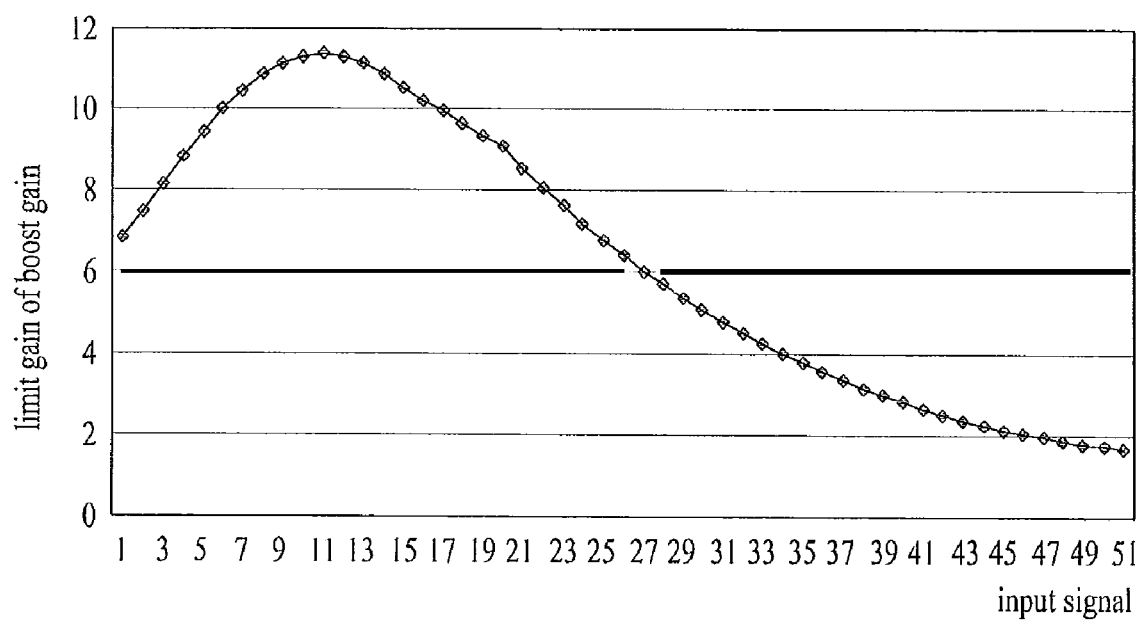

FIG. 14A and FIG. 14B are graphs for examples of a non-linear gain curve used for another embodiment of the present invention. Referring to FIG. 14A, when a volume of an input signal is small, a volume is controlled to increase relatively more by applying a gain of a larger value. If a volume of an input signal is large, it is able to relatively increase a volume little further. Referring to FIG. 14B, only if an input signal has a specific volume value, it is able to control a volume to increase relatively. Thus, according to one embodiment of the present invention, an input signal is controlled using a non-linear gain curve, whereby a dynamic range of the input signal can be variously controlled if necessary.

The volume modifying unit (volume control unit) 1360 generates an output signal by controlling a volume of an input signal in a manner of applying a second gain to an input signal in a current frame. Thus, since the second gain is generated using a preceding gain and a non-linear gain curve, it is able to prevent the occurrence of howling attributed to an excessively large dynamic range of an output signal or it is able to prevent a fluctuating signal from being outputted. Meanwhile, the volume modifying unit 1260 is able to control a volume of an input signal in a frequency domain.

Moreover, a preceding gain stored in the memory 1320 can include a second gain for an input signal in a preceding frame. After an input signal has been modified, a second gain for an input signal in a current frame can be stored in the memory 1220.

Figure 15:
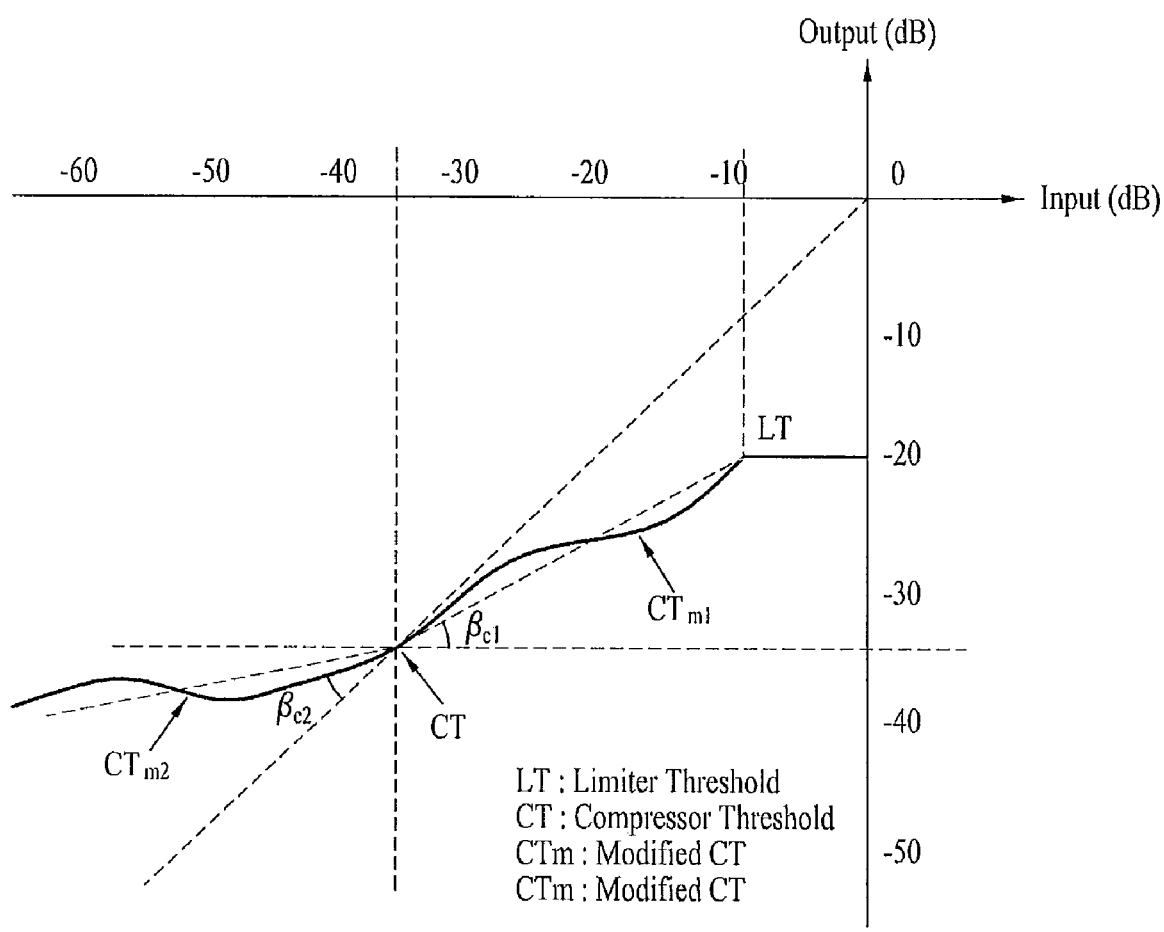
FIG. 15 and FIG. 16 are graphs indicating detailed parameters of a non-linear gain curve used for another embodiment of the present invention.
Figure 16:
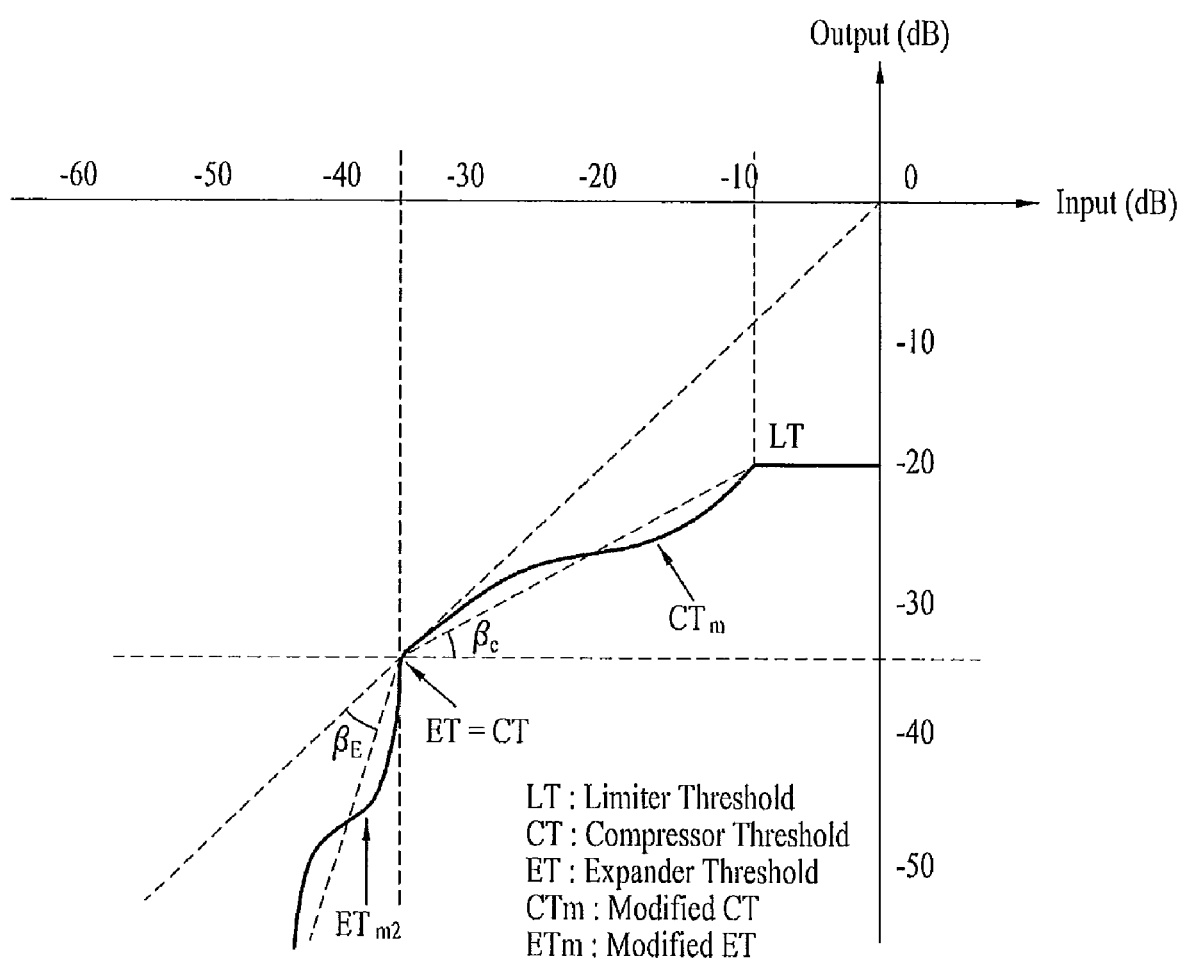

FIG. 15 and FIG. 16 are graphs for detailed parameters of a non-linear gain curve used for another embodiment of the present invention. FIG. 15 and FIG. 16 show relations between volumes of input and output signals represented as a non-linear gain curve. In particular, FIG. 15 shows a non-linear gain curve playing a role as a compressor for decreasing a volume dynamic range of an input signal. FIG. 16 shows a non-linear gain curve playing a role as a compressor (if an input signal is equal to or greater than a predetermined value)

and an expander for increasing a volume dynamic range of the input signal (if the input signal is smaller than the predetermined value).

Referring to FIG. 15, a horizontal axis indicates a volume of an input signal and a vertical axis indicates a volume of an output signal. First of all, a non-linear gain curve is able to generate a linear gain curve using a volume compressor a strength, volume expander strength and a target volume. In this case, if an input signal is greater than a limiter threshold (LT), it will be outputted with a uniform volume irrespective of a volume of the input signal. If an input signal is equal to or smaller than LT, a volume of the input signal will be determined according to a linear slope curve that is determined by a volume compressor strength. Yet, in case that a volume of an input signal is controlled using a linear slope curve, howling may occur in an output signal.

Therefore, an audio signal volume controller according to one embodiment of the present invention generates a non-linear gain curve by further using a maximum compression volume, thereby reducing or solving the aforesaid problems.

Referring to FIG. 15 again, a non-linear gain curve is generated by modifying a linear gain curve using a compressor threshold (CT) indicating a point solely bypassed without controlling a volume level of a signal inputted with a user-specific volume, compressor strength parameters ($\beta_{C1}$, $\beta_{C2}$) indicating an extent of decreasing a volume of an input signal having a volume ranging between CT and LT and an extent of increasing a volume of an input signal having a volume smaller than CT, and a reference target ($CT_{m1}$, or $CT_{m2}$) indicating an output volume corresponding to an input signal necessary to be compressed most among input signals having the volume between CT and LT or input signals having the volume smaller than CT. In this case, an effect of compressor for the input signal can be further increased centering on the reference target. In case that a non-linear gain curve is generated by the above method, it can be observed that a dynamic range of an output volume of an input signal is further reduced around a reference target.

FIG. 16 shows a non-linear gain curve playing a role as a compressor in a range over a predetermined value (ET=CT) or an expander in a range below the predetermined value. Like the non-linear gain curve, a non-linear gain curve, which is applied to an input signal over CT to play a role as a compressor, is determined using a compressor strength parameter and a reference target. Like the compressor, an expander is able to further decrease a dynamic range of a volume around a specific volume. In this case, using ETM which is a reference volume corresponding to a volume of an input signal necessary to be compressed least in decreasing an input signal having a volume below CT, it is able to determine a non-linear gain curve applied to an input signal below CT. In case that the non-linear gain curve is generated by the above method, it can be observed that a dynamic range of an output volume of an input signal is further decreased around a reference target in a volume range in which the non-linear gain curve plays a role as a compressor.

Thus, using a non-linear gain curve, it is able to decrease a volume dynamic range of an output signal rather than using a related art linear gain curve. Therefore, the present invention is able to reduce howling or unpleasant signal occurring due to considerable fluctuation.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

Accordingly, the present invention provides the following effects and/or advantages.

First of all, a volume of an input signal is controlled using a non-linear gain curve indicating a relation between volume of an input signal and volume of an output signal. Therefore, the present invention is able to reduce or expand a dynamic range of an output volume.

Secondly, the present invention is able to control a volume according to a genre of an input signal, a channel of an input signal or the like using metadata, which describes features of the input signal, as reference information.

Thirdly, the present invention is able to control a volume of an input signal adaptively to influence of an outside environment using outside environment information, which is measured from an outside environment adjacent to a decoding apparatus of an audio signal, as reference information.

Fourthly, the present invention is able to automatically control a volume of an input signal in consideration of user's characteristics using previously stored storage reference information received from a memory as reference information.

Fifthly, a gain of a previous frame is used to control a volume of an input signal in a current frame. Therefore, the present invention is able to control an output volume of an input signal to avoid considerable volume fluctuation according to a frame.

The invention claimed is:

1. A method of controlling output volume of a signal, comprising:
   obtaining non-linearity information regarding a non-linear gain curve, the non-linear gain curve indicating a relation between a volume of an input signal and a volume of an output signal;
   receiving the input signal and target volume information indicating a target volume of the input signal;
   determining a first gain by using the volume of the input signal and the target volume information;
   determining a second gain from one of a) the volume of the input signal and the target volume information or b) the first gain, by using the non-linear gain curve; and
   adjusting the volume of the input signal by applying the second gain to the input signal,
   wherein the non-linear gain curve is a modified linear gain curve generated by using the non-linearity information including at least one of a maximum compressing volume and a minimum compressing volume, and
   wherein the linear gain curve is generated by using at least one of volume compressor strength information, volume expander strength information, and the target volume.

2. The method of claim 1, wherein the maximum compressing volume indicates a target volume corresponding to an input volume which is substantially reduced and wherein the minimum compressing volume indicates a target volume corresponding to an input volume which is substantially expanded.

3. The method of claim 1, wherein the first gain and the second gain are determined per sub-band.

4. The method of claim 1, further comprising:
   receiving a preceding gain of the input signal in a preceding frame; and
   modifying the first gain by using the preceding gain.

5. The method of claim 4, wherein the preceding gain is a gain of the input signal in the preceding frame.

6. The method of claim 4, wherein the modified first gain is applied to the first gain by a difference value between the first gain and the preceding gain.

7. The method of claim 4, wherein the second gain is stored as the preceding gain.

8. The method of claim 1, wherein the determining of the first gain further comprises:
- converting the input signal into an input signal of a frequency domain;
- obtaining a target volume from the target volume information;
- obtaining a difference value between the input signal of the frequency domain and the target volume;
- applying the difference value to the input signal of the frequency domain; and
- determining the first gain by using the input signal.

9. An apparatus for controlling an input signal, comprising:
- a volume measuring unit measuring a volume of the input signal;
- a memory storing target volume information indicating a target volume of the input signal and non-linearity information regarding non-linear gain curve, the non-linear gain curve indicating a relation between a volume of the input signal and a volume of an output signal;
- a first gain determining unit determining a first gain by using the volume of the input signal and the target volume information;
- a second gain determining unit determining a second gain from the first gain, by using the non-linear gain curve; and
- a volume control unit adjusting the volume of the input signal by applying the second gain to the input signal,
- wherein the non-linear gain curve is a modified linear gain curve generated by using the non-linearity information including at least one of a maximum compressing volume and a minimum compressing volume, and
- wherein the linear gain curve is generated by using at least one of volume compressor strength information, volume expander strength information, and the target volume.

10. The apparatus of claim 9, wherein the volume measuring unit converts the input signal into an input signal of a frequency domain and wherein the volume control unit adjusts a volume of the input signal of the frequency domain.

11. The apparatus of claim 9, wherein the maximum compressing volume indicates a target volume corresponding to an input volume which is substantially reduced and wherein the minimum compressing volume indicates a target volume corresponding to an input volume which is substantially expanded.

12. The apparatus of claim 9, further comprising:
- a first gain modifying unit modifying the first gain by using a preceding gain and outputting the modified first gain to the second gain determining unit, and
- wherein the memory further stores the preceding gain of the input signal in a preceding frame.

13. The apparatus of claim 9, wherein the memory further stores the second gain as the preceding gain.

* * * * *